(12) United States Patent
Tsao et al.

(10) Patent No.: US 9,455,176 B2
(45) Date of Patent: Sep. 27, 2016

(54) MANUFACTURING METHOD FOR FORMING SEMICONDUCTOR STRUCTURE WITH SUB-FIN STRUCTURES

(71) Applicant: UNITED MICROELECTRONICS CORP., Hsin-Chu (TW)

(72) Inventors: Po-Chao Tsao, New Taipei (TW); Lung-En Kuo, Tainan (TW); Chien-Ting Lin, Hsinchu (TW); Shih-Fang Tzou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/072,370

(22) Filed: Mar. 17, 2016

(65) Prior Publication Data

US 2016/0197005 A1  Jul. 7, 2016

Related U.S. Application Data

(63) Continuation of application No. 14/159,457, filed on Jan. 21, 2014, now abandoned.

(51) Int. Cl.
| | |
|---|---|
| *H01L 21/762* | (2006.01) |
| *H01L 29/06* | (2006.01) |
| *H01L 21/308* | (2006.01) |
| *H01L 21/3105* | (2006.01) |
| *H01L 21/027* | (2006.01) |
| *H01L 21/8234* | (2006.01) |

(52) U.S. Cl.
CPC ..... *H01L 21/76224* (2013.01); *H01L 21/0273* (2013.01); *H01L 21/3086* (2013.01); *H01L 21/31053* (2013.01); *H01L 21/823431* (2013.01); *H01L 21/823481* (2013.01); *H01L 29/0653* (2013.01); *H01L 29/0657* (2013.01)

(58) Field of Classification Search
None
See application file for complete search history.

(56) References Cited

U.S. PATENT DOCUMENTS

| | | |
|---|---|---|
| 8,617,996 B1 | 12/2013 | Chi |
| 8,753,940 B1 | 6/2014 | Wei |
| 8,802,521 B1 | 8/2014 | Hung |
| 9,087,870 B2 | 7/2015 | Tong |
| 9,147,612 B2 | 9/2015 | Huang |
| 9,190,496 B2 | 11/2015 | Lin |
| 2011/0097889 A1 | 4/2011 | Yuan |
| 2013/0277759 A1 | 10/2013 | Chen |
| 2013/0309838 A1 | 11/2013 | Wei |
| 2013/0330889 A1 | 12/2013 | Yin |
| 2014/0091434 A1* | 4/2014 | Hopkins ........... H01L 27/10894 257/618 |
| 2014/0227848 A1* | 8/2014 | Kang ............... H01L 21/823431 438/283 |
| 2015/0380262 A1 | 12/2015 | Bergendahl |

OTHER PUBLICATIONS

Huang, Title of Invention: Method for Forming a Semiconductor Structure, U.S. Appl. No. 14/088,445, filed Nov. 25, 2013.

* cited by examiner

*Primary Examiner* — Andres Munoz
(74) *Attorney, Agent, or Firm* — Winston Hsu; Scott Margo

(57) ABSTRACT

The present invention provides a semiconductor structure including a substrate, at least one fin group and a plurality of sub-fin structures disposed on the substrate, wherein the fin group is disposed between two sub-fin structures, and a top surface of each sub-fin structure is lower than a top surface of the fin group; and a shallow trench isolation (STI) disposed in the substrate, wherein the sub-fin structures are completely covered by the shallow trench isolation.

11 Claims, 7 Drawing Sheets

MANUFACTURING METHOD FOR FORMING SEMICONDUCTOR STRUCTURE WITH SUB-FIN STRUCTURES

CROSS REFERENCE TO RELATED APPLICATIONS

This application is a continuation application of U.S. patent application Ser. No. 14/159,457 filed Jan. 21, 2014, which is herein incorporated by reference in its entirety.

BACKGROUND OF THE INVENTION

1. Field of the Invention

The present invention relates to a semiconductor structure and the manufacturing method thereof, in particular, to a semiconductor structure with sub-fin structures which can protect other main fin structures from damage.

2. Description of the Prior Art

With increasing miniaturization of semiconductor devices, various Multi-gate MOSFET devices have been developed. The Multi-gate MOSFET is advantageous for the following reasons. Manufacturing processes of Multi-gate MOSFET devices can be integrated into traditional logic device processes, and thus are more compatible. In addition, since the three-dimensional structure of the Multi-gate MOSFET increases the overlapping area between the gate and the substrate, the channel region is controlled more effectively. This reduces both the drain-induced barrier lowering (DIBL) effect and the short channel effect. Moreover, as the channel region is longer for the same gate length, the current between the source and the drain is increased.

A multi-gate MOSFET has a gate formed on fin-shaped structures, and the fin-shaped structures are formed on a substrate, wherein the fin-shaped structures formed by etching the substrate are strip structures parallel with each other. With the demands of miniaturization of semiconductor devices, the width of each fin-shaped structure narrows and the spacing between the fin-shaped structures shrinks. Thus, forming fin-shaped structures which can achieve the required demands under the restrictions of miniaturization, physical limitations and various processing parameters becomes an extreme challenge.

SUMMARY OF THE INVENTION

The present invention provides a semiconductor structure, comprising a substrate, at least one fin group and a plurality of sub-fin structures disposed on the substrate, wherein the fin group is disposed between two sub-fin structures, and a top surface of each sub-fin structure is lower than a top surface of the fin group; and a shallow trench isolation (STI) disposed in the substrate, wherein the sub-fin structures are completely covered by the shallow trench isolation.

The present invention further provides a manufacturing method for forming a semiconductor structure, at least comprising the following steps: first, a substrate is provided, having a plurality of dummy fin structures being disposed on the substrate, and a plurality of patterned hard masks being disposed on the dummy fin structures. Afterwards, parts of the patterned hard masks disposed on the dummy fin structures are removed, and an etching process is performed, so as to form at least one fin group and a plurality of sub-fin structures disposed on the substrate, wherein a top surface of each sub-fin structure is lower than a top surface of the fin group. Finally, a shallow trench isolation is formed in the substrate, wherein the sub-fin structures are completely covered by the shallow trench isolation.

The present invention provides a semiconductor structure and a manufacturing process for forming a semiconductor structure. In this semiconductor structure, besides comprising the fin groups disposed on the substrate, the semiconductor structure further comprises a plurality of sub-fin structures disposed on the end side of the fin group. The sub-fin structures can help to protect the fin groups from damage. In this way, the fin groups may avoid damage easily, and the quality of the semiconductor devices can be further increased.

These and other objectives of the present invention will no doubt become obvious to those of ordinary skill in the art after reading the following detailed description of the preferred embodiment that is illustrated in the various figures and drawings.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-11 are schematic diagrams showing the method for forming the semiconductor structure according to the first preferred embodiment of the present invention, wherein:

FIG. 1 is the schematic diagram showing that a sacrificial layer is formed on a substrate;

FIG. 2 is the schematic diagram showing the spacer is formed;

FIG. 3 is the schematic diagram showing the sacrificial layer is removed;

FIG. 4 is the schematic diagram showing the pattern is transferred into the hard mask;

FIG. 5 is the schematic diagram showing the pattern is transferred into the substrate;

FIG. 6 is the schematic diagram showing the a patterned photoresist layer is formed on the substrate;

FIG. 7 is the schematic diagram showing the hard masks disposed on the dummy fin structures which are not covered by the patterned photoresist layer are then removed;

FIG. 8 is the schematic diagram showing the patterned photoresist layer is then removed;

FIG. 9 is the schematic diagram showing at least one fin group and a plurality of sub-fin structure are formed;

FIG. 10 is the schematic diagram showing a liner and an insulating layer are then formed;

FIG. 11 is the schematic diagram showing a planarization process is performed;

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
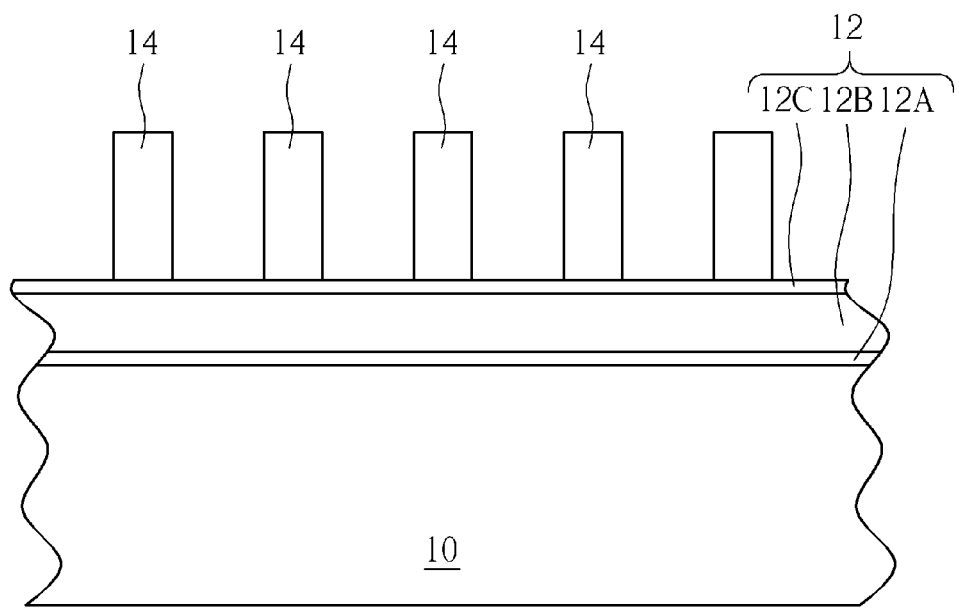
Figure 2:
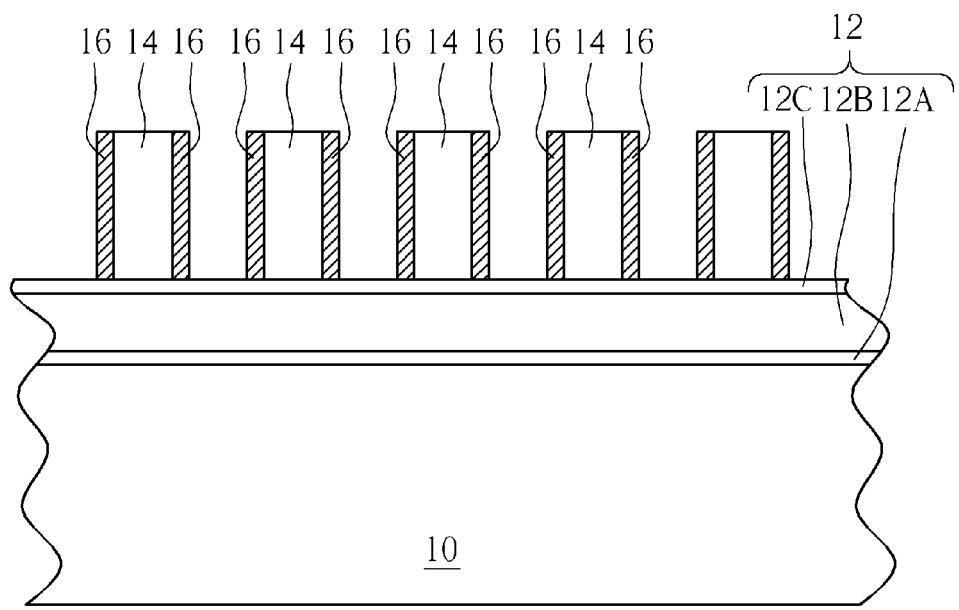
Figure 3:
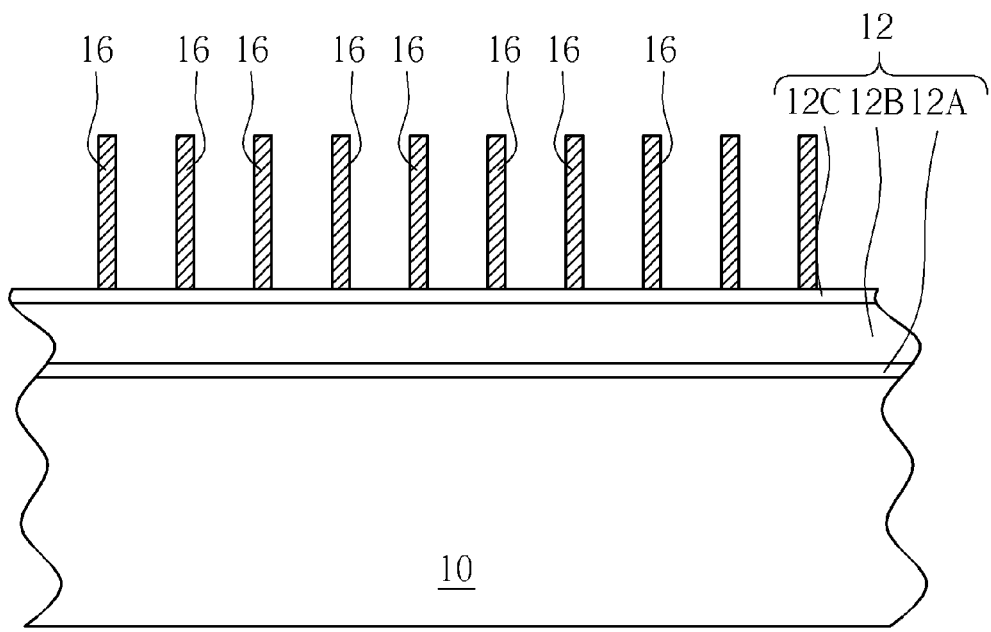

FIGS. 1-11 are schematic diagrams showing the method for forming the semiconductor structure according to the first preferred embodiment of the present invention. As shown in FIGS. 1-3, a plurality of spacers 16 is formed on a substrate 10. More precisely, as shown in FIG. 1, a target layer such as a substrate 10 is provided. The substrate 10 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A hard mask 12 is formed on the substrate 10, wherein the hard mask 12 may be a single layer structure or a multiple layer structure, and the material of the hard mask 12 comprises silicon oxide or silicon nitride, but not limited thereto. In this embodiment, the hard mask 12 is a tri-layer structure, including a lower hard mask 12A consisting of silicon oxide, a middle hard mask 12B consisting of silicon nitride and an upper hard mask 12C consisting of silicon oxide, but not limited thereto.

A plurality of sacrificial patterns 14 are formed on the substrate 10. In this embodiment, the method of forming the sacrificial patterns 14 is integrated into a gate process. For example, a gate process can be performed to form a plurality of sacrificial gates which serve as the sacrificial patterns 14 on the substrate 10, but it is not limited thereto. In one case, the sacrificial patterns 14 are formed through a traditional gate process, such as polysilicon gates, but the material is not restricted therein.

Afterwards, as shown in FIG. 2, a plurality of spacers 16 is formed on the substrate 10 next to the sacrificial patterns 14. More precisely, a spacer material (not shown) conformally covers the sacrificial patterns 14 and the substrate 10, and the spacer material is then etched to form the spacers 16. This step can be integrated into a gate process. The spacers 16 may be nitride spacers, but are not limited thereto. The spacer 16 may be composed of materials having etching selectivity to the material of the sacrificial patterns 14, and the spacers 16 may be composed of multi dielectric layers.

As shown in FIG. 3, the sacrificial patterns 14 are then removed, so the spacers 16 remain on the substrate 10 and the parts of the substrate 10 directly below the sacrificial patterns 14 are exposed.

Figure 4:
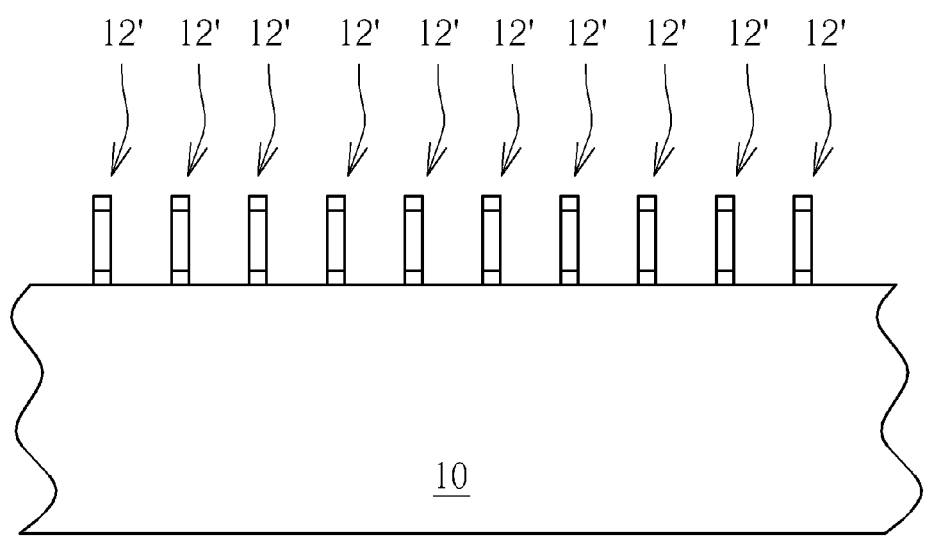

As shown in FIG. 4, a pattern transferring process is then performed, so that the pattern of the spacers 16 is transferred to hard mask 12 to form a plurality of patterned hard mask 12'. For instance, an etching process (not shown) is performed to etch the hard mask 12 by using the spacers 16 to serve as hard masks; thereby, the plurality of patterned hard mask 12' are formed on the substrate 10. The method using the spacer serve as the hard mask called the "sidewall image transfer" (SIT) process. The etching process may be a dry etching process, a wet etching process, or a sequentially performed dry and wet etching process, etc. In this embodiment, since the hard mask 12 is a tri-layer structure, each patterned hard mask 12' comprises a silicon nitride layer disposed between two silicon oxide layers, but not limited thereto. In another case, the spacers 16 and parts of each patterned hard mask may be consumed (removed) during the pattern transferring process, so each of the patterned hard masks 12' may be a single layer structure or a multiple layer structure.

Figure 5:
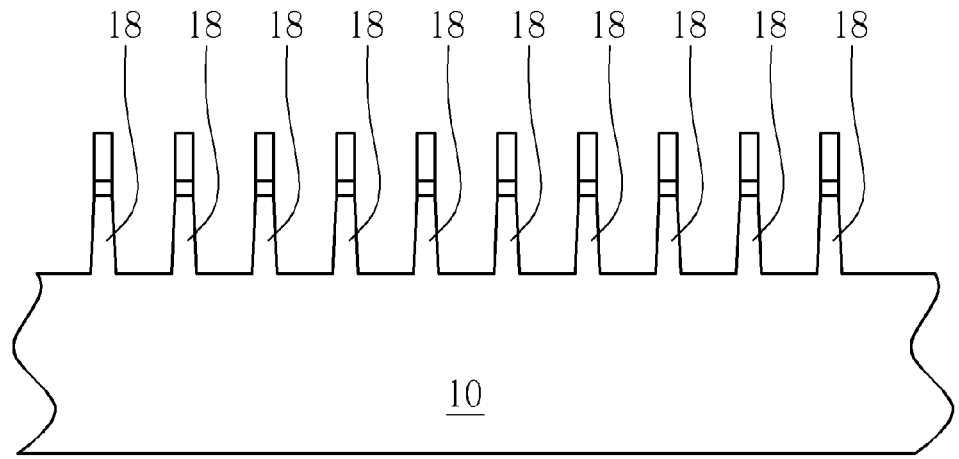

Afterwards, as shown in FIG. 5, an etching process is performed, to etch parts of the substrate 10 that are not covered by the hard mask 12', so as to form a plurality of dummy fin structures 18 disposed on the substrate 10. In the present invention, since the dummy fin structures 18 are formed by etching the substrate 10, the material of each dummy fin structures 18 is same as the material of the substrate 10. In addition, each hard mask 12' may still remain on the dummy fin structure 18, however, in this embodiment, some portion of the hard mask 12' is consumed during the etching process, but not limited thereto. Each of the hard masks 12' may be a single layer structure or a multiple layer structure in this step.

Figure 6:
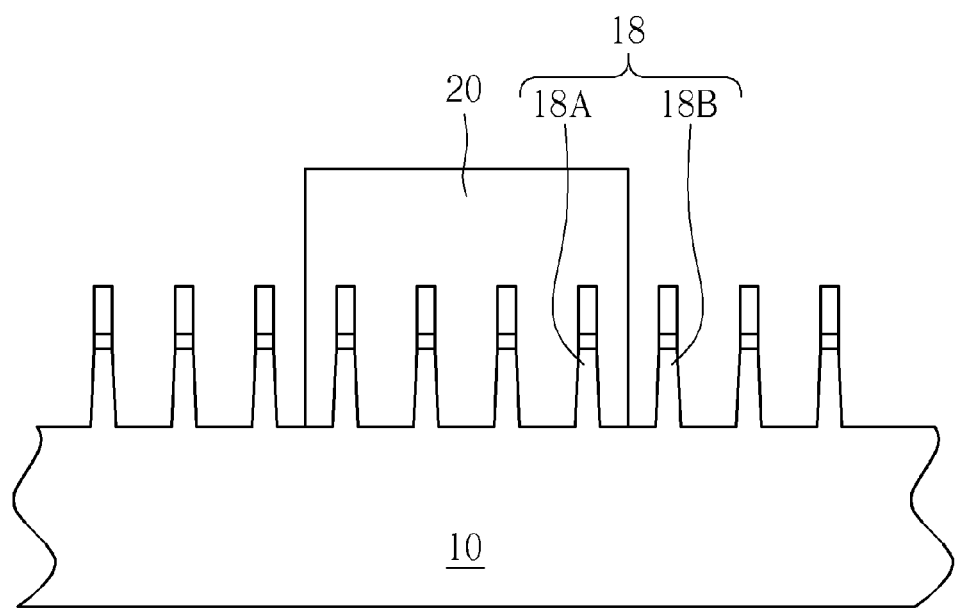

As shown in FIG. 6, a patterned photoresist layer 20 is then formed on the substrate 10, covering parts of the hard masks 12' and parts of the dummy fin structures 18. In this step, the dummy fin structures 18 can be divided into two groups: dummy fin structures 18A which are covered by the patterned photoresist layer 20; and the dummy fin structures 18B which are not covered by the patterned photoresist layer 20. In this case, the dummy fin structures 18A will be formed into the main fin structure in the following process, wherein the dummy fin structures 18A are disposed corresponding to the layout of the semiconductor device. On the other hand, those dummy fin structures 18B which are not covered by the patterned photoresist layer 20 will not be formed into the main fin structure in the following steps. Therefore, the dummy fin structures 18B are disposed beside the dummy fin structures 18A covered by the photoresist layer 20. More precisely, a plurality of dummy fin structures 18A covered by the photoresist layer 20 can be deemed as a "group", and the group is disposed between two dummy fin structures 18B. In addition, the dummy fin structures 18B can decrease the loading effect too. It is worth noting that in this step, a cutting process can be performed after the photoresist layer 20 is formed, to separate each rectangular loop shaped dummy fin structures 18A into a plurality of strip shaped structures, but in the present invention, the cutting process is not limited to performed in this step, and it can be performed in the previous steps or in subsequent steps too.

Figure 7:
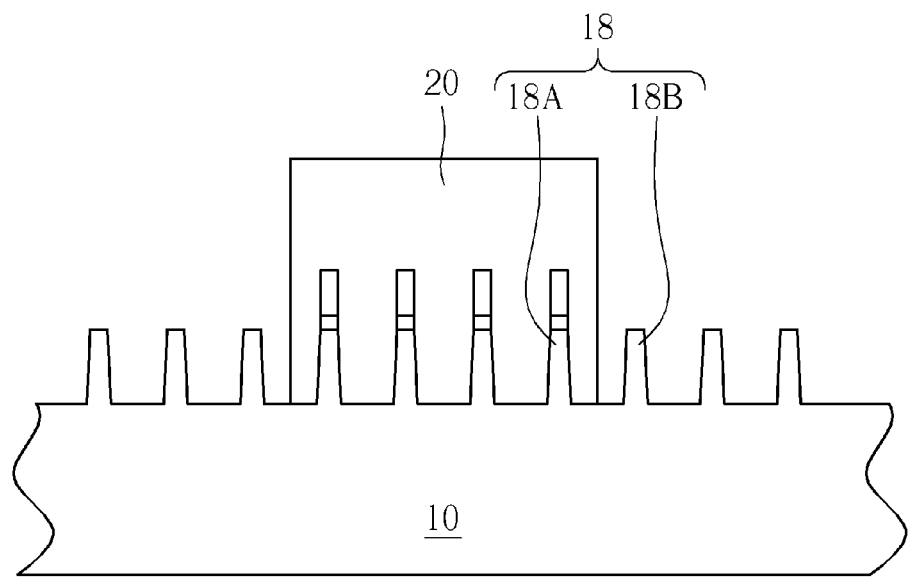
Figure 8:
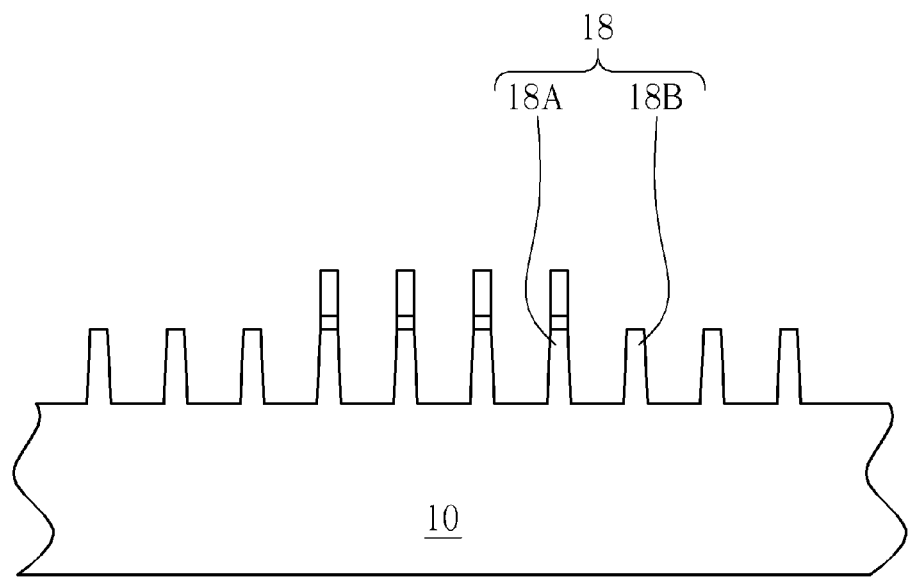

Next, as shown in FIGS. 7-8, the hard masks 12' disposed on the dummy fin structures 18B which are not covered by the patterned photoresist layer 20 are then removed. In other words, an etching process is performed, to remove the exposed hard masks 12' which are not protected by the photoresist layer 20. Afterwards, as shown in FIG. 8, the patterned photoresist layer 20 is then removed. It may be removed through an etching process or other methods, and the present invention is not limited thereto.

Figure 9:
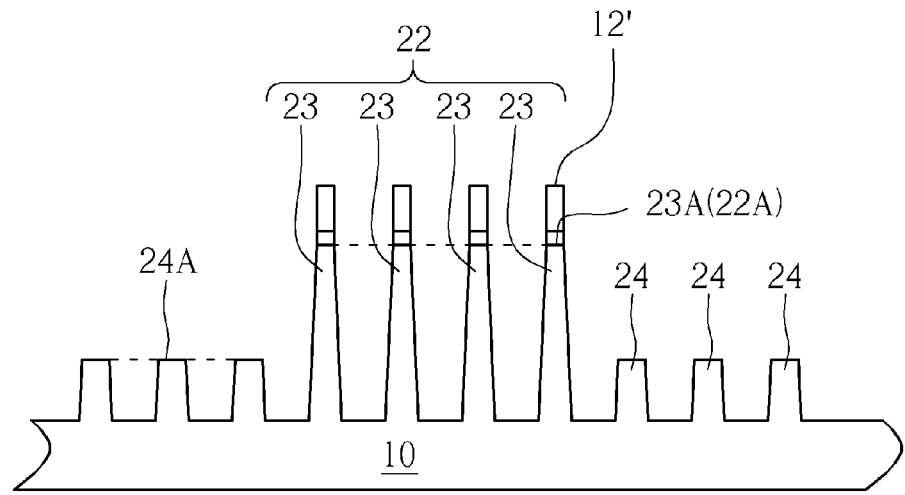

Afterwards, as shown in FIG. 9, another etching process is then performed, to etch the substrate 10, so as to form at least one fin group 22 and a plurality of sub-fin structure 24, wherein the fin group 22 includes a plurality of main fin structures 23. The fin group 22 is disposed between two sub-fin structures 24. In this step, since each main fin structure 23 is protected by the hard masks 12' while the etching process is performed, each dummy fin structure 18B which not covered by the hard masks 12' is consumed during the etching process. Therefore, each top surface 23A of the main fin structure 23 and each top surface 24A of the sub-fin structure 24 are not on a same level, more precisely, each top surface 23A of the main fin structure 23 is higher each top surface 24A of the sub-fin structure 24. In this embodiment, the etching time and the etching method can be adjusted, so as to control the height of the main fin structures 23 and the height of the sub-fin structures 24.

Figure 10:
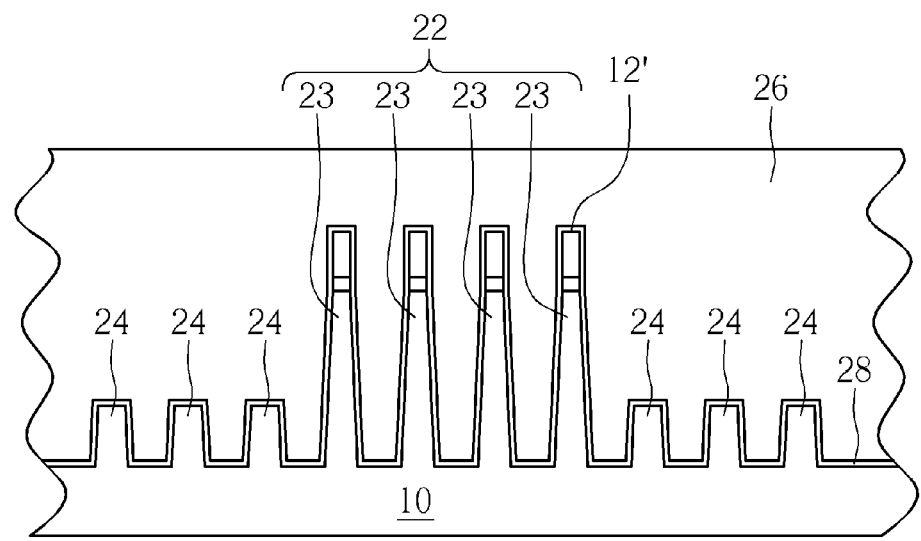
Figure 11:
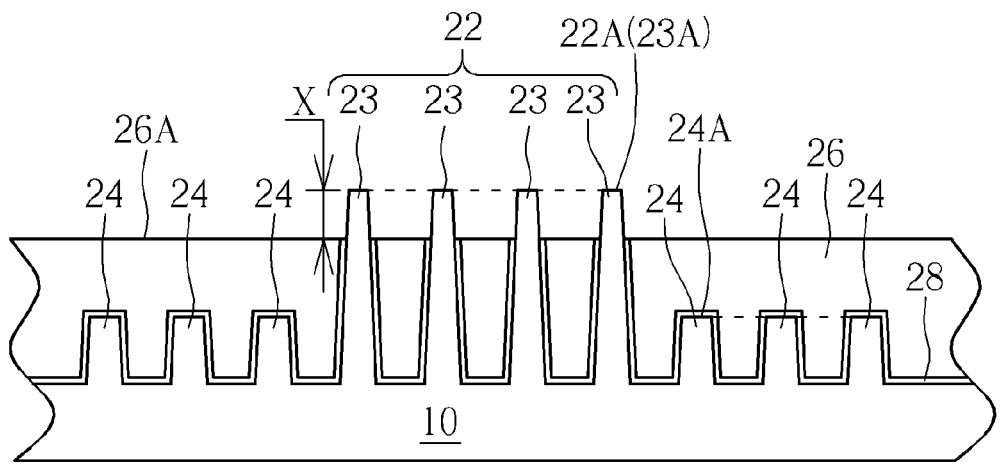

Please refer to FIGS. 10-11, afterwards, as shown in FIG. 10, a liner 28 and an insulating layer 26 are then formed on the substrate 10, covering the main fin structures 23 and the sub-fin structures 24, and filling in each gap between the main fin structure 23 and the sub-fin structure 24. Therefore, the liner 28 has a recessed and protruding profile. The insulating layer 26 can be a silicon oxide layer, but not limited thereto. The insulating layer 26 is used for forming the shallow trench isolation (STI) in the following steps. Next, as shown in FIG. 11, a planarization process such as an etching back process and/or a chemical mechanical polishing (CMP) are performed, to remove the extra insulating layer 26 on the hard masks 12'. It is worth noting that during the planarization process, the remaining hard masks 12' are used as the stop layer. In other words, after the planarization process is performed, the top surface is stopped on the hard masks 12'. Finally, in order to form the shallow trench isolations (STI) in the substrate 10, an etching back process is performed, to remove parts of the insulating layer 26 and to expose partial main fin structure 23, but it is worth noting that each sub-fin structure 24 is completely covered by the insulating layer 26 (STI). After the etching back process is performed, the top surface of the exposed liner 28 and the top surface of the insulating layer 26 (STI) are on a same level. In the present invention, the exposed main fin structure 23 can be deemed as the "device fin", which can be electrically connected to a device through at least one trace (not shown) in the following steps, and each sub-fin structure 24 can be deemed as a "floating structure", which is electrically isolated from these devices mentioned above. The height of the exposed main fin structure 23 (device fin) and the height of the sub-fin structure 24 can be adjusted during the manufacturing process. In this embodiment, as shown in FIG. 11, if the height of the main fin structure 23 is labeled as "X" (the height from a top surface 26A of the insulating layer 26 to a top surface of the fin group 22), and the height of the sub-fin structure 24 (the height from a bottom of the insulating layer 26 to a top surface of the sub-fin structure 24) is preferably between the range of 0.9X-2X, but not limited thereto. If the condition that the top surface 24A of the sub-fin structure 24 is lower than the top surface 23A of the main fin structure 23, it should be comprised in the scope of the present invention.

Figure 12A:
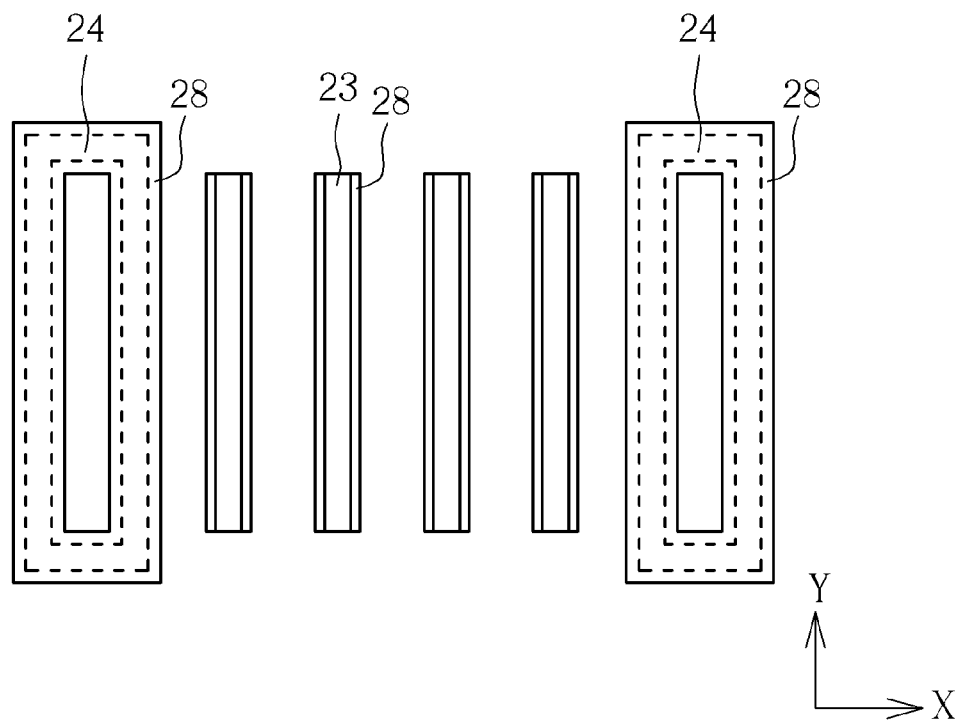
FIG. 12A is partial top view diagram of FIG. 11.

The semiconductor structure of the present invention, as shown in FIG. 11, at least includes: a substrate 10, at least one fin group 22 and at least one sub-fin structure 24 disposed on the substrate 10, wherein the fin group 22 is disposed between two sub-fin structures 24, and a top surface 24A of the sub-fin structure 24 is lower than a top surface 22A of the fin group 22, and an insulating layer 26 disposed on the substrate 10. In the present invention, the fin group 22 includes a plurality of main fin structures 23, a top surface of the insulating layer 26A is lower than the top surface of the fin group 22A, and a top surface of the insulating layer 26A is higher than the top surface of the sub-fin structure 24A. In addition, each fin group 22 is electrically connected to a device through at least one trace (not shown), and each sub-fin structure 24 is electrically isolated from the device. It is worth noting that if the cutting process mentioned above has not been performed yet, it can be performed in this step; and parts of the liner 28 surrounding the main fin structures 23 will be cut. Please refer to FIG. 12A, FIG. 12A is partial top view diagram of FIG. 11. As shown in FIG. 12A, after the cutting process is performed, the liner 28 is disposed on two sides of each main fin structure 23, but each sub-fin structure 24 is completely covered by the liner 28. It is worth noting that in this embodiment, the cutting direction of the cutting process is extended along a first direction orthogonal with the direction of the main fin structure (such as the X-axis). In addition, in the present invention, each main fin structure 23 is strip shaded, separated from each other, and each sub-fin structure 24 is still rectangular loop shaped when viewed in a top view. In FIG. 12A, since the cutting process is performed after the liner 28 and the insulating layer are formed, therefore, only parts of the main fin structure 23 and the liner 28 disposed on the main fin structure 23 will be cut, and in this embodiment, each main fin structure 23 has four edges, at least two edges are exposed by the liner 23 when viewed in top view, and another two edges are still covered by the liner 28.

Figure 12B:
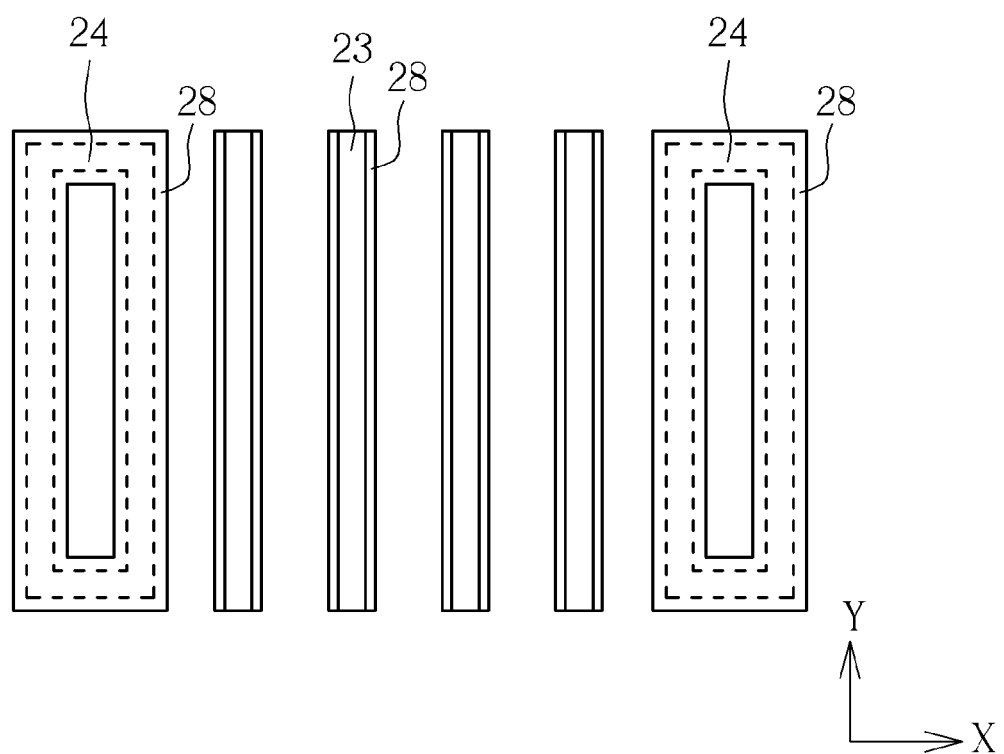
FIG. 12B is partial top view diagram of FIG. 11 of another embodiment.

In another case, please refer to 12B, FIG. 12B is partial top view diagram of FIG. 11 of another embodiment, in this embodiment, the cutting direction of the cutting process is extended along a first direction parallel to the direction of the main fin structure (such as the Y-axis), and after the cutting process, each loop shaded main fin structure 23 are divided into a plurality of strip shaped components. In this embodiment, parts of the liner 28 close to two ends of each main fin structure 23 are removed. Similarly, each main fin structure 23 has four edges, at least two edges are exposed by the liner 23 when viewed in top view, and another two edges are still partially covered by the liner 28.

The feature of the present invention is that the present invention further comprises a plurality of sub-fin structures 24 disposed beside the fin group 22. Usually, in the following process for forming a fin-FET device, some thermal processes such as an anneal process may be performed on the insulating layer, and some tensile or compressive stresses may be formed in the insulating layer during the thermal process. These stresses would influence and damage the main fin structure, so in order to avoid these issue, the present invention further comprises a plurality of sub-fin structures 24, disposed beside the fin group 22, thereby absorbing the stresses preferentially, and protecting the main fin structures 23 of the fin group 22 from the damage occurring by the thermal processes.

In summary, the present invention provides a semiconductor structure and a manufacturing process for forming a semiconductor structure. In this semiconductor structure, besides comprising the fin groups disposed on the substrate, the semiconductor structure further comprises a plurality of sub-fin structures disposed on the end side of the fin group. The sub-fin structures can help to protect the fin groups from damage. In this way, the fin groups may avoid damage easily, and the quality of the semiconductor devices can be further increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method for forming a semiconductor structure, comprising the following steps:
provding a substrate, having a plurality of dummy fin structures being disposed on the substrate, and a plurality of patterned hard masks being disposed on the plurality of dummy fin structures;

removing parts of the plurality of patterned hard masks disposed on the plurality of dummy fin structures;

performing an etching process to etch the substrate and the plurality of dummy fin structures simultaneously after said parts of the plurality of patterned hard masks are removed, and so as to simultaneously form at least one fin group and a plurality of sub-fin structures disposed in the substrate, wherein a top surface of each sub-fin structure of the plurality of sub-fin structures is lower than a top surface of the at least one fin group;

forming a liner covering and directly contacting each sub-fin structure of the plurality of sub-fin structures entirely, wherein the liner includes a recessed and protruding profile; and forming a shallow trench isolation (STI) made of an insulating layer in the substrate, wherein the plurality of sub-fin structures are completely covered by the shallow trench isolation.

2. The method of claim 1, wherein the process for removing said parts of the plurality of patterned hard masks comprises:

forming a patterned photoresist layer to cover parts of the plurality of dummy fin structures and parts of the plurality of patterned hard masks; and performing an etching process, to remove the plurality of patterned hard masks that are not covered by the patterned photoresist layer.

3. The method of claim 1, further comprising performing a planarization process after the insulating layer is formed on the at least one fin group and the plurality of sub-fin structures.

4. The method of claim 3, further comprising performing an etching back process to the insulating layer, so as to expose parts of the at least one fin group.

5. The method of claim 3, further comprising performing an anneal process to the insulating layer.

6. The method of claim 1, wherein the at least one fin group is disposed between two sub-fin structures of the plurality of sub-fin structures.

7. The method of claim 1, wherein each sub-fin structure of the plurality of sub-fin structures is a floating structure which is electrically isolated from a device.

8. The method of claim 1, wherein the at least one fin group includes a plurality of main fin structures.

9. The method of claim 1, wherein the method for forming the plurality of patterned hard mask comprises a sidewall image transfer process.

10. The method of claim 1, further comprising performing an etching back process to remove parts of the STI and to remove parts of the liner, after the etching back process is performed, a top surface of the STI and a top surface of the liner are on a same level, and parts of the liner are exposed by the STI.

11. The method of claim 1, wherein after said parts of the plurality of patterned hard masks are removed, the rest of the plurality of patterned hard masks is exposed during the etching process.

* * * * *